(12) United States Patent
Lee

(10) Patent No.: US 7,816,730 B2
(45) Date of Patent: Oct. 19, 2010

(54) SEMICONDUCTOR DEVICE AND METHOD FOR FABRICATING THE SAME

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 41 days.

(21) Appl. No.: 11/846,509

(22) Filed: Aug. 28, 2007

(65) Prior Publication Data

US 2008/0251839 A1    Oct. 16, 2008

(30) Foreign Application Priority Data

Apr. 12, 2007    (KR) .......................... 10-2007-36067

(51) Int. Cl.
*H01L 29/78* (2006.01)
(52) U.S. Cl. .................. 257/331; 257/E21.654
(58) Field of Classification Search .......... 257/331, 257/E21, E29; 438/268, 157, 164, 283, 525
See application file for complete search history.

(56) References Cited

U.S. PATENT DOCUMENTS

| | | | |
|---|---|---|---|
| 6,127,233 A * | 10/2000 | Rodder ........................ | 438/300 |
| 6,233,313 B1 | 5/2001 | Farris et al. | |
| 6,465,335 B1 * | 10/2002 | Kunikiyo ..................... | 438/592 |
| 6,504,907 B1 | 1/2003 | Farris et al. | |
| 6,642,090 B1 * | 11/2003 | Fried et al. ................... | 438/164 |
| 7,172,943 B2 | 2/2007 | Yeo et al. | |
| 2004/0202295 A1 | 10/2004 | Shen et al. | |
| 2004/0255126 A1 | 12/2004 | Reith | |
| 2005/0014353 A1 * | 1/2005 | Mansoori et al. ............ | 438/592 |
| 2005/0095793 A1 * | 5/2005 | Lee ............................ | 438/294 |
| 2005/0233565 A1 | 10/2005 | Zhu et al. | |

FOREIGN PATENT DOCUMENTS

| | | |
|---|---|---|
| CN | 1906769 A | 1/2007 |
| KR | 1020030065864 A | 8/2003 |
| KR | 1020060027440 A | 3/2006 |
| KR | 1020070014610 A | 2/2007 |

OTHER PUBLICATIONS

Korean Intellectual Property Office, Notice of Rejection, Application No. 10-2007-0036067, Apr. 24, 2008.
Ponomarev, Y., "High-Performance Deep SubMicron CMOS Technologies with Polycrystalline-SiGe Gates," *IEEE Transactions on Electron Devices*, 47:4 (Apr. 2000).

* cited by examiner

*Primary Examiner*—Wai-Sing Louie
*Assistant Examiner*—Sue Tang
(74) *Attorney, Agent, or Firm*—Townsend and Townsend and Crew LLP

(57) ABSTRACT

A semiconductor device comprises a fin-type active region defined by a semiconductor substrate having a device isolation structure, a recess formed over the fin-type active region, and a gate electrode including a silicon germanium ($Si_{1-x}Ge_x$) layer for fill the recess (where 0<X<1 and X is a Ge mole fraction).

10 Claims, 9 Drawing Sheets

(i)

(ii)

US 7,816,730 B2

SEMICONDUCTOR DEVICE AND METHOD FOR FABRICATING THE SAME

CROSS-REFERENCES TO RELATED APPLICATIONS

The priority of Korean patent application number 10-2007-0036067, filed on Apr. 12, 2007, which is incorporated by reference in its entirety, is claimed.

BACKGROUND OF THE INVENTION

The invention generally relates to a semiconductor device. More particularly, the invention relates to a semiconductor comprising of a fin-transistor and a method for fabricating the same.

In a fin-channel-array-transistor (FCAT), a fin channel transistor has a three-dimensional structure where a tri-gate surrounds a channel. It is possible to manufacture the fin channel structure with existing manufacturing technology. The fin channel structure has more surface area to reduce short channel effects between a drain region and a source region. The fin channel structure allows a reduction in channel doping concentration which reduces leakage current through a junction region.

A lower gate electrode of the fin channel transistor includes a p+ polysilicon layer. A work function of the p+ polysilicon layer is larger than that of a p– silicon substrate. Using a DRAM cell as an example, when there is a binary "1" voltage in the drain region while the fin channel transistor is turned off, a leakage current in the drain region is increased due to a gate induced drain leakage ("GIDL") phenomenon. As a result, data retention of a DRAM cell (in this case "1") is reduced which degrades a refresh characteristic of the DRAM.

BRIEF SUMMARY OF THE INVENTION

Embodiments of the invention are directed to a semiconductor device comprising of a fin transistor having a stacked structure having a p+ poly silicon layer and a p+ poly silicon germanium ($Si_{1-x}Ge_x$) layer, thereby improving gate induced drain leakage effects and refresh characteristics of a semiconductor device.

According to one embodiment, a semiconductor device comprises: a fin-type active region disposed in a semiconductor substrate having a device isolation structure, a recess formed over the fin-type active region, and a gate electrode formed over the fin-type active region to fill the recess, the gate electrode including a silicon germanium ($Si_{1-x}Ge_x$) layer (where 0<x<1 and X is a Ge mole fraction).

According to another embodiment, a method for fabricating a semiconductor device comprises: forming a device isolation structure on a semiconductor substrate to define an active region; selectively etching a portion of the device isolation structure to form a fin-type active region; and forming a gate structure over the fin-type active region, the gate structure including a silicon germanium ($Si_{1-x}Ge_x$) layer (where 0<x<1 and X is a Ge mole fraction).

DESCRIPTION OF EMBODIMENTS

Figure 1:
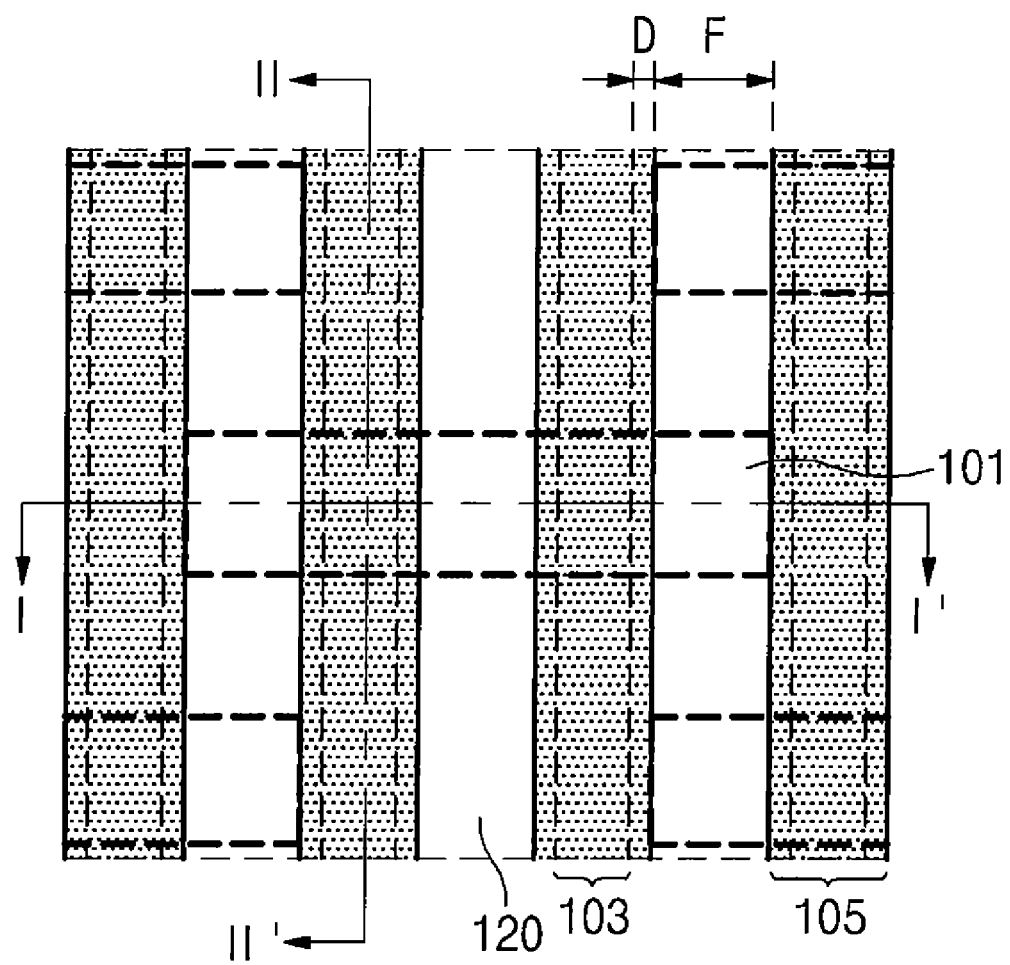
FIG. 1 is a layout illustrating a semiconductor device according to an embodiment of the invention.

FIG. 1 is a layout illustrating a semiconductor device according to an embodiment of the invention. The semiconductor device comprises of an active region 101 defined by a device isolation region 120, a recess gate region 103, and a gate region 105. A longitudinal direction of gate region 105 is defined as a "vertical direction", and a longitudinal direction of active region 101 is defined as a "horizontal direction". Recess gate region 103 is overlapped with gate region 105. A horizontal line-width of one side of recess gate region 103 is shown to be smaller than F by D (where 0≦D<F/2 and F is a distance between two neighboring gate regions 105). That is, a horizontal line-width of recess gate region 103 is F–2D.

Figure 2:
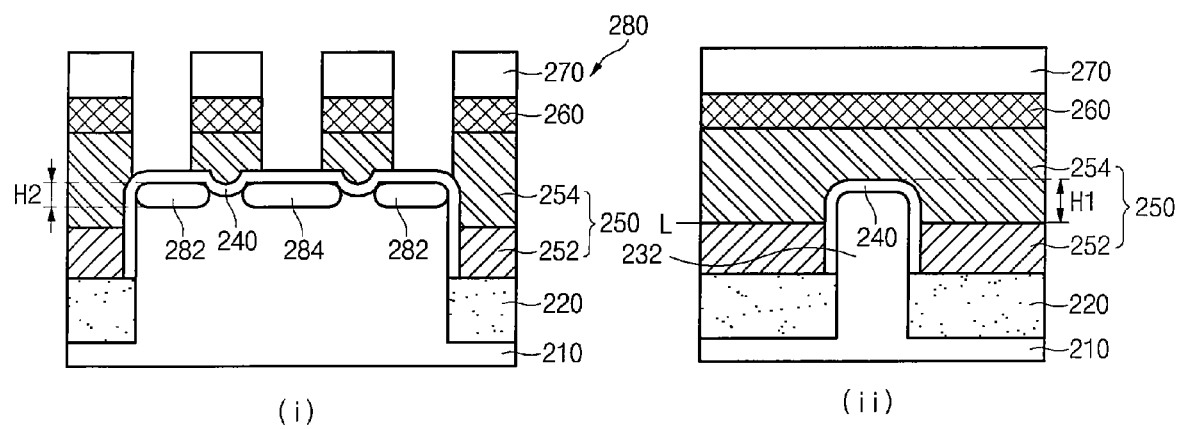
FIG. 2 is a cross-sectional view illustrating a semiconductor device according to an embodiment of the invention.

FIG. 2 is a cross-sectional view illustrating a semiconductor device according to an embodiment of the invention. FIG. 2(i) is a cross-sectional view taken along I-I' of FIG. 1, and FIG. 2(ii) is a cross-sectional view taken along II-II' of FIG. 1. A gate structure 280 includes a lower gate electrode 250 that fills a fin-type active region 232. Lower gate electrode 250 has a stacked structure including a first lower gate electrode 252 and a second lower gate electrode 254. First lower gate electrode 252 includes a p+ poly silicon layer, and second lower gate electrode 254 includes a p+ poly silicon germanium ($Si_{1-x}Ge_x$) layer.

An upper portion of lower gate electrode 250 from its top surface to a level L is formed of second lower gate electrode 254, and its lower portion is formed with first lower gate electrode 252 (see FIG. 2(ii)). A stacked structure including the p+ poly silicon germanium ($Si_{1-x}Ge_x$) layer and the p+ poly silicon layer improves a GIDL characteristic because the p+ poly silicon germanium ($Si_{1-x}Ge_x$) layer has a smaller work function than that of the p+ poly silicon layer. As a result, data retention of a storage node can be increased, thereby improving a refresh characteristic of the DRAM. In one embodiment, a depth of second lower gate electrode 254 below the top surface of fin type active region 232 (or the top surface of a gate insulation film 240) is H1. In addition, the depth H1 is formed to be the same as or larger than a depth H2 of a storage node junction region 282 and a bit line junction region 284 (see FIG. 2).

Figure 3A:
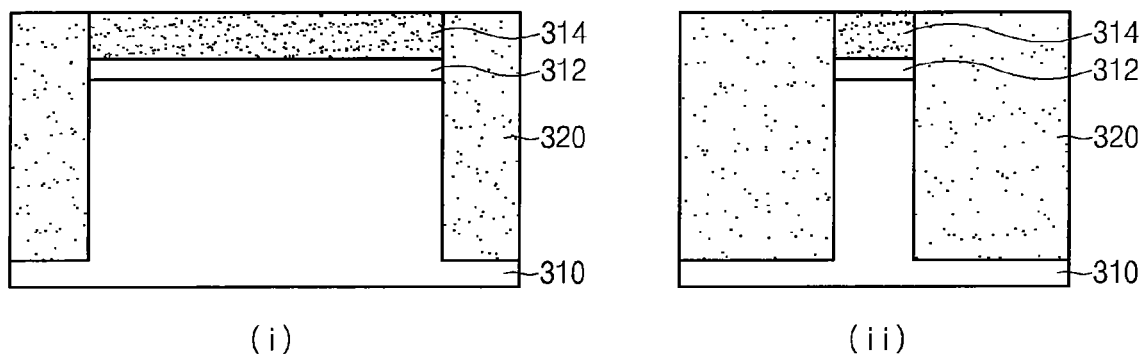
FIGS. 3a to 3g are cross-sectional views illustrating a method for fabricating a semiconductor device according to an embodiment of the invention.

FIGS. 3a to 3g are cross-sectional views illustrating a method for fabricating a semiconductor device according to an embodiment of the invention. FIG. 3a(i) to FIG. 3g(i) are cross-sectional views taken along I-I' of FIG. 1, and FIGS. 3a(ii) to 3g(ii) are cross-sectional views taken along II-II' of FIG. 1. A pad oxide film 312 and a pad nitride film 314 are formed over a semiconductor substrate 310. A photoresist film (not shown) is formed over pad nitride film 314. The photoresist film is exposed and developed using a device isolation mask (not shown) to form a photoresist pattern (not shown) that defines a device isolation region. Pad nitride film 314, pad oxide film 312, and a portion of semiconductor substrate 310 are etched using the photoresist pattern as an etching mask to form a trench (not shown) that defines active region 101 of FIG. 1. The photoresist pattern is then removed.

An insulating film for device isolation (not shown) is formed to fill the trench. The insulating film for device isolation is polished (or removed) until pad nitride film 314 is exposed, to form a device isolation structure 320. The process of polishing (or removing) the insulating film for device isolation is performed by a chemical mechanical polishing ("CMP") method or an etch-back method.

Figure 3B:
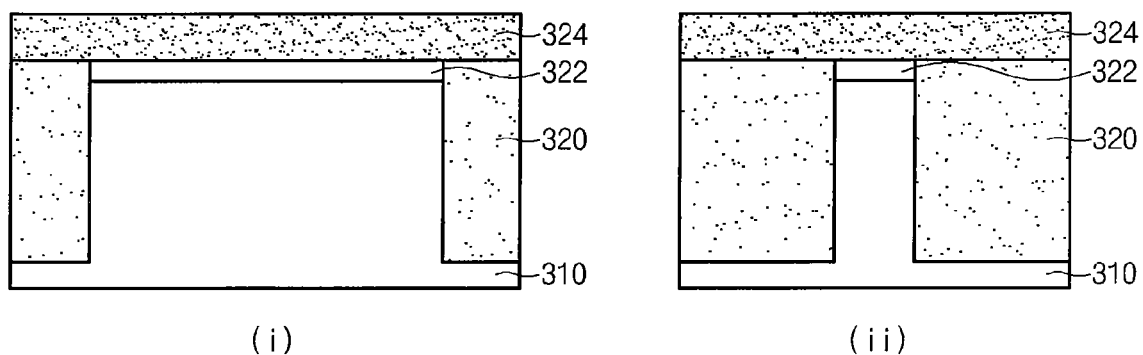

Referring to FIG. 3b, device isolation structure 320 is selectively etched (or removed) to lower the height. Pad nitride film 314 and pad oxide film 312 are removed to expose semiconductor substrate 310. A first oxide film 322 is formed over semiconductor substrate 310. A photoresist film (not shown) is formed over semiconductor substrate 310. The photoresist film is exposed and developed using a mask for exposing a cell region, to form a photoresist pattern (not shown). An ion-implanting process is performed using the photoresist pattern as a mask to form a cell and a channel ion-implanting region (not shown). The photoresist pattern is then removed. A hard mask layer 324 is formed over semiconductor substrate 310 and device isolation structure 320. In one embodiment, the process of etching device isolation structure 320 is performed by a wet etching method. In addition, the process of removing pad oxide film 312 and pad nitride film 314 is performed by a wet etching method.

Figure 3C:
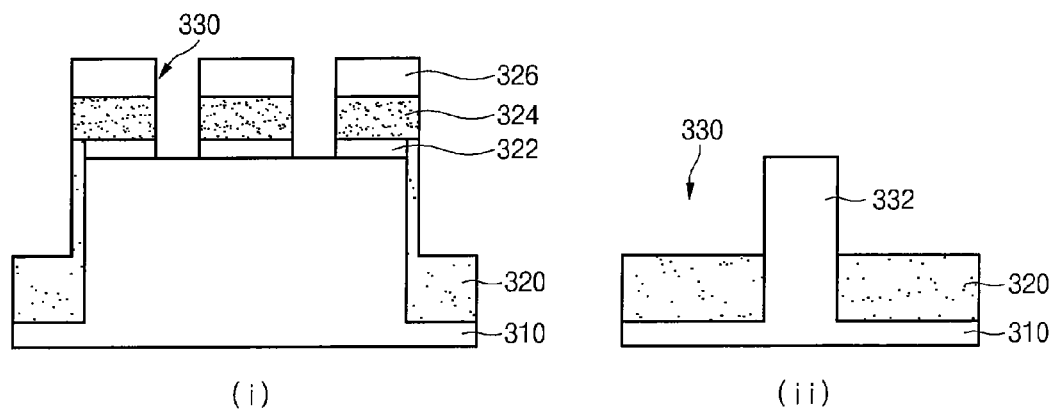

Referring to FIG. 3c, a photoresist film (not shown) is formed over hard mask layer 324. The photoresist film is exposed and developed using a recess gate mask (not shown) to form a photoresist pattern 326 that defines recess gate region 103 of FIG. 1. Hard mask layer 324 is etched using photoresist pattern 326 as an etching mask to expose first oxide film 322. A portion of device isolation structure 320 is selectively etched to form a recess 330 that define a fin type active region 332. In one embodiment, during the process of etching device isolation structure 320, first oxide film 322 is removed. Hard mask layer 326 is selected from a group consisting of an amorphous carbon film, a polysilicon layer, a nitride film, and combinations thereof.

Figure 3D:
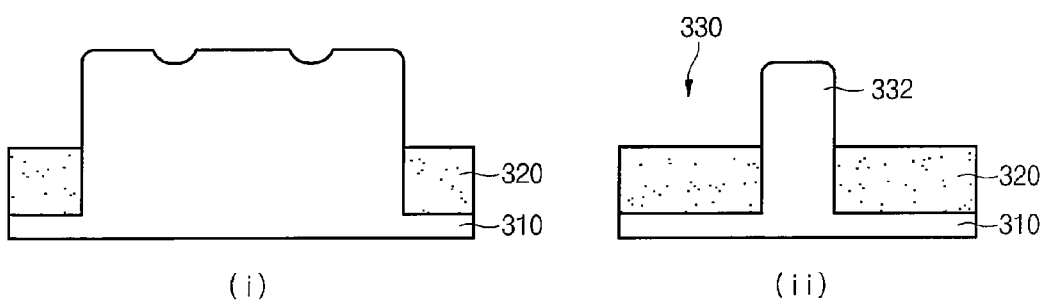

Referring to FIG. 3d, areas exposed by the recess 330 are subjected to a soft etching process which rounds the exposed surfaces of semiconductor substrate 310 and fin type active region 332. Impurity ions are implanted into semiconductor substrate 310 and fin type active region 332, the surface of which are rounded, to form an ion-implanting region (not shown) for adjusting a threshold voltage. Photoresist pattern 326 and hard mask layer 324 are then removed. First oxide film 322 is removed to expose semiconductor substrate 310. In one embodiment, the soft etching process involves an isotropic etching method. In addition, the process of removing first oxide film 322 is performed by a wet etching method.

Figure 3E:
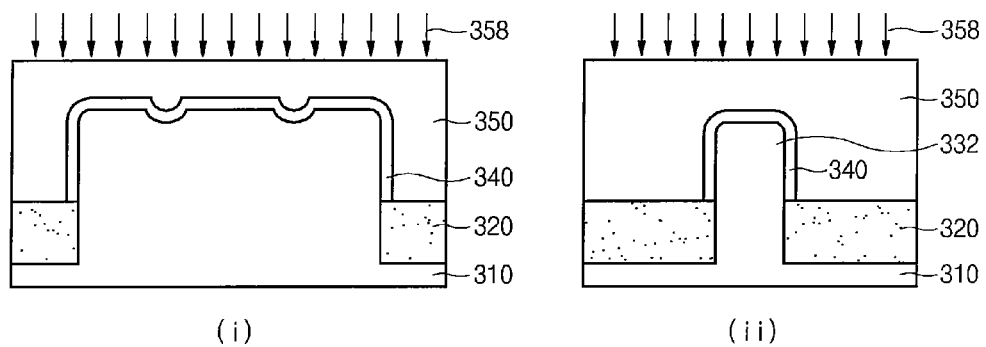

Referring to FIG. 3e, a gate insulating film 340 is formed over semiconductor substrate 310 and fin type active region 332. A lower gate conductive layer 350 is formed over semiconductor substrate 310 and device isolation structure 320 to fill recess 330 and enclose fin type active region 332. A photoresist film (not shown) is formed over lower gate conductive layer 350. The photoresist film is exposed and developed using a mask that defines a cell region to form a photoresist pattern (not shown) exposing the cell region. An ion-implanting process 358 including Ge is performed on lower gate conductive layer 350 by using the photoresist pattern as a mask. In one embodiment, lower gate conductive layer 350 includes a p+ poly silicon layer.

In another embodiment of the invention, gate insulating film 340 is formed over semiconductor substrate 310 and fin active region 332. A p+ poly silicon layer serving as lower gate conductive layer 350 is formed over semiconductor substrate 310 and device isolation structure 320 to at least fill recess 330 and fin type active region 332. Lower gate conductive layer 350 is polished by a CMP method or removed by an etch-back method. A photoresist film (not shown) is formed over lower gate conductive layer 350. The photoresist film is exposed and developed using a mask that defines a cell region to form a photoresist pattern exposing the cell region. An ion-implanting process 358 including Ge may be performed on lower gate conductive layer 350 by using the photoresist pattern as a mask. In another embodiment of the present invention, an energy of ion-implanting process 358 is in a range of about 10 keV to 40 keV. In addition, a dosage of ion-implanting process 358 is in a range of about 1E15 ions/cm$^2$ to 5E16 ions/cm$^2$.

Figure 3F:
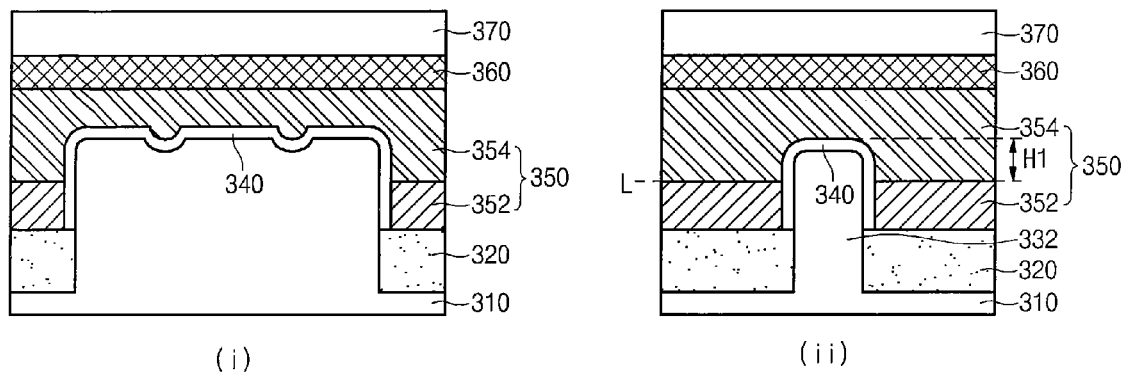

Referring to FIG. 3f, the photoresist pattern is then removed. A thermal treatment process is applied to lower gate conductive layer 350 to diffuse impurities including Ge. The thermal treatment process should be performed in a manner that the impurities (Ge) mostly remain at an upper portion of the lower gate conductive layer 350. As a result, lower gate conductive layer 350 has a stacked structure including a first lower gate conductive layer 352 and a second lower gate conductive layer 354.

In one embodiment, first lower gate conductive layer 352 includes a p+ poly silicon layer. Second lower gate conductive layer 354 includes a p+ poly silicon germanium ($Si_{1-x}Ge_x$) layer from the p+ poly silicon layer where the Ge ions are diffused. In another embodiment, a depth of second lower gate conductive layer 354 below the top surface of fin type active region 332 (or the top surface of gate insulation film 340) is H1. In addition, the depth H1 may be equal to or larger than a depth H2 of a storage node junction region 382 and a bit line junction region 384 shown in FIG. 3g. An upper gate conductive layer 360 and a gate hard mask layer 370 are formed over second lower gate conductive layer 354.

In one embodiment, second lower gate conductive layer 354 is polished by a CMP method or an etch-back method. Upper gate conductive layer 360 is selected from a group consisting of a titanium nitride (TiN) layer, a tungsten nitride (WN) layer, a tungsten (W) layer, a titanium (Ti) layer, a cobalt (Co) layer, a titanium silicide ($TiSi_x$) layer, a tungsten silicide ($WSi_x$) layer, a cobalt silicide ($CoSi_x$) layer, and combinations thereof.

Figure 3G:
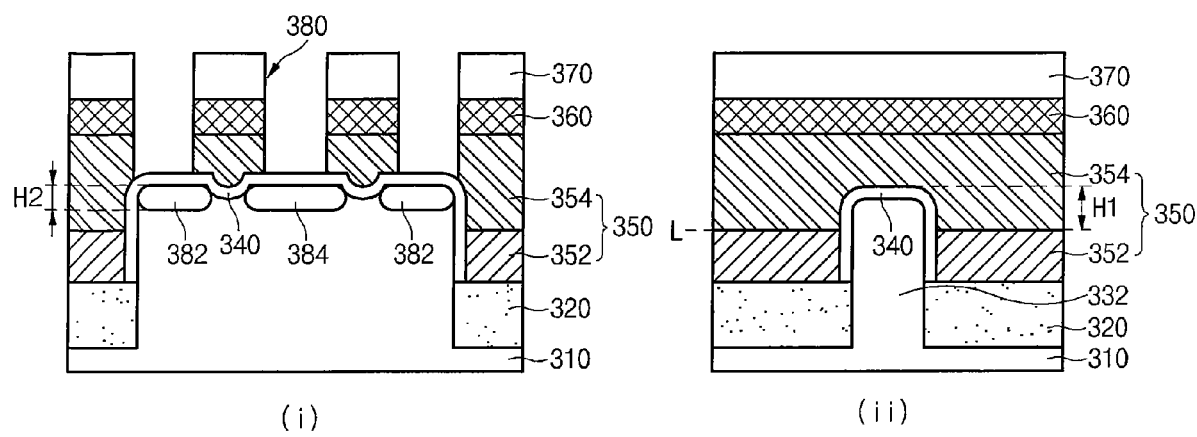

Referring to FIG. 3g, a photoresist film (not shown) is formed over gate hard mask layer 370. The photoresist film is exposed and developed using a mask that defines a gate region 105 of FIG. 1, to form a photoresist pattern (not shown). Gate hard mask layer 370, upper gate conductive layer 360 and lower gate conductive layer 350 are patterned using the photoresist film as an etching mask to form a gate structure 380. The photoresist pattern is then removed. An ion-implanting process is performed on semiconductor substrate 310 to form storage node junction region 382 and bit line junction region 384. Junction region 384 may serve as a LDD region and/or a source/drain region. A depth of storage node junction region 382 and bit line junction region 384 is H2.

Figure 4A:
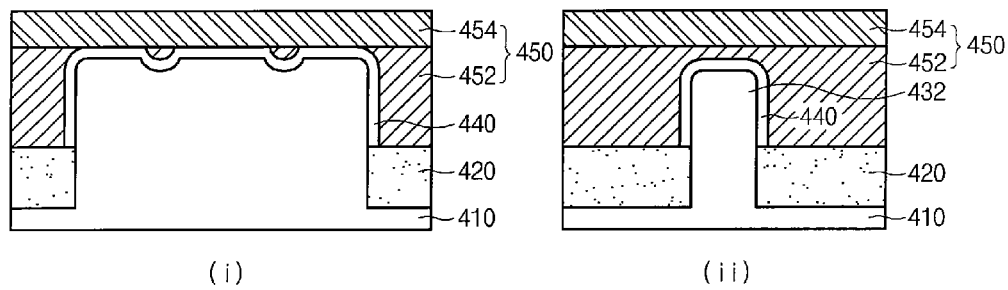
FIGS. 4a and 4b are cross-sectional views illustrating a method for fabricating a semiconductor device according to an embodiment of the invention.
Figure 4B:
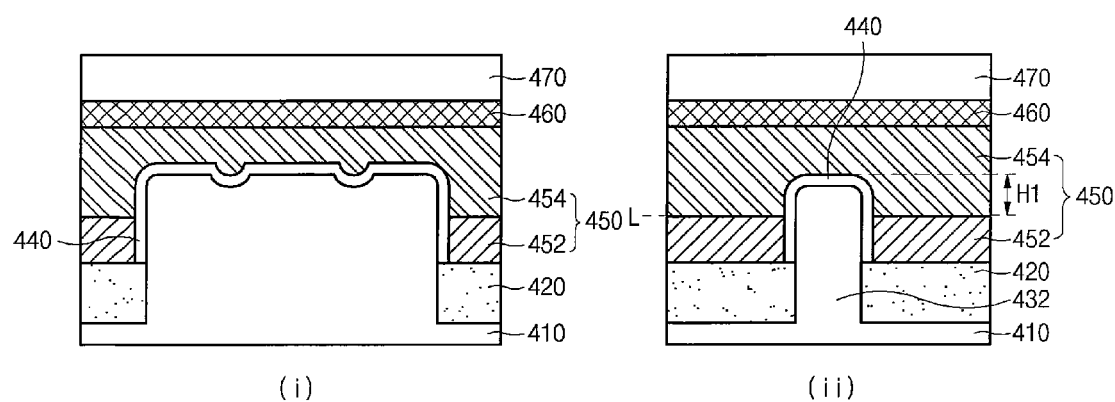

FIGS. 4a and 4b are cross-sectional views illustrating a method for fabricating a semiconductor device according to another embodiment of the invention. A gate insulating film 440 is formed over a semiconductor substrate 410 including a fin type active region 432. A first lower gate conductive layer 452 is formed over semiconductor substrate 410 to fill a recess (not shown) and enclose fin-type active region 432. First lower gate conductive layer 452 is polished by a CMP method or removed by an etch-back method. A second lower gate conductive layer 454 doped with impurities is formed over first lower gate conductive layer 452. In one embodiment, first lower gate conductive layer 452 includes a p+ poly silicon layer. Second lower gate conductive layer 454 includes a p+ poly silicon germanium $Si_{1-x}Ge_x$ layer.

A thermal treatment process is subjected on second lower gate conductive layer 454 to diffuse the impurities downward. Second lower gate conductive layer 454 is expanded to a level L below the top surface of fin type active region 432 (or the top surface of gate insulation film 440) A lower gate conductive layer 450 has a stacked structure including a p+ poly silicon layer and a p+ poly silicon germanium $Si_{1-x}Ge_x$ layer. An upper gate conductive layer 460 and a gate hard mask layer 470 are formed over lower gate conductive layer 450. In one embodiment, H1 is equal to or larger than a depth H2 of storage node junction region 382 and bit line junction region 384 of FIG. 3g.

Figure 5A:
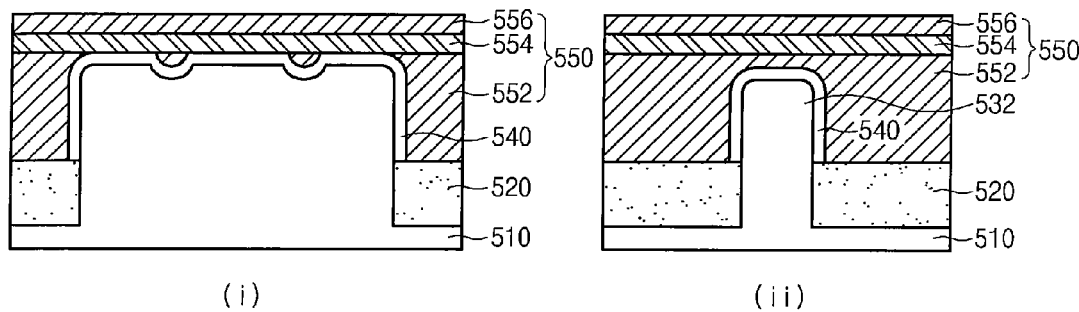
FIGS. 5a and 5b are cross-sectional views illustrating a method for fabricating a semiconductor device according to another embodiment of the invention.
Figure 5B:
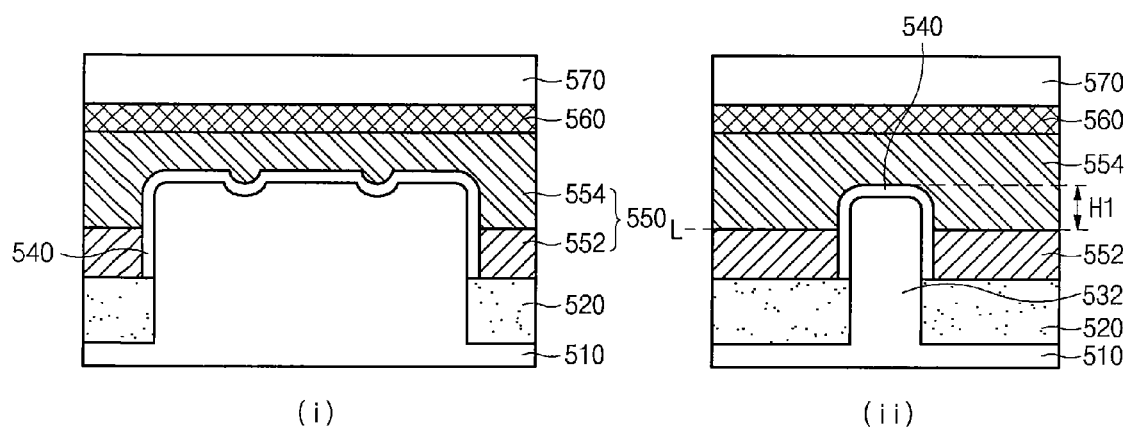

FIGS. 5a and 5b are cross-sectional views illustrating a method for fabricating a semiconductor device according to another embodiment of the invention. A gate insulating film 540 is formed over a semiconductor substrate 510 including a fin type active region 532. A first lower gate conductive layer 552 is formed over semiconductor substrate 510 to fill a recess (not shown) and enclose fin type active region 532. First lower gate conductive layer 552 is polished by a CMP method or an etch-back method. A second lower gate conductive layer 554 doped with impurities is formed over first lower gate conductive layer 552. A third lower gate conductive layer 556 is formed over second lower gate conductive layer 554. In one embodiment, first lower gate conductive layer 552 and third lower gate conductive layer 556 include a p+ poly silicon layer. Second lower gate conductive layer 554 includes a p+ poly silicon germanium $Si_{1-x}Ge_x$ layer.

Referring to FIG. 5b, a thermal treatment process is applied to lower gate conductive layer 550 to diffuse impurities doped in second lower gate conductive layer 554, so that second lower gate conductive layer 554 is formed from the top surface of lower gate conductive layer 550 to H1. Lower gate conductive layer 550 has a stacked structure including a p+ polysilicon layer and a p+ poly silicon germanium $Si_{1-x}Ge_x$ layer. An upper gate conductive layer 560 and a gate hard mask layer 570 are formed over a lower gate conductive layer 550. In one embodiment, H1 is equal to or larger than a depth H2 of storage node junction region 382 and bit line junction region 384 of FIG. 3g.

Figure 6:
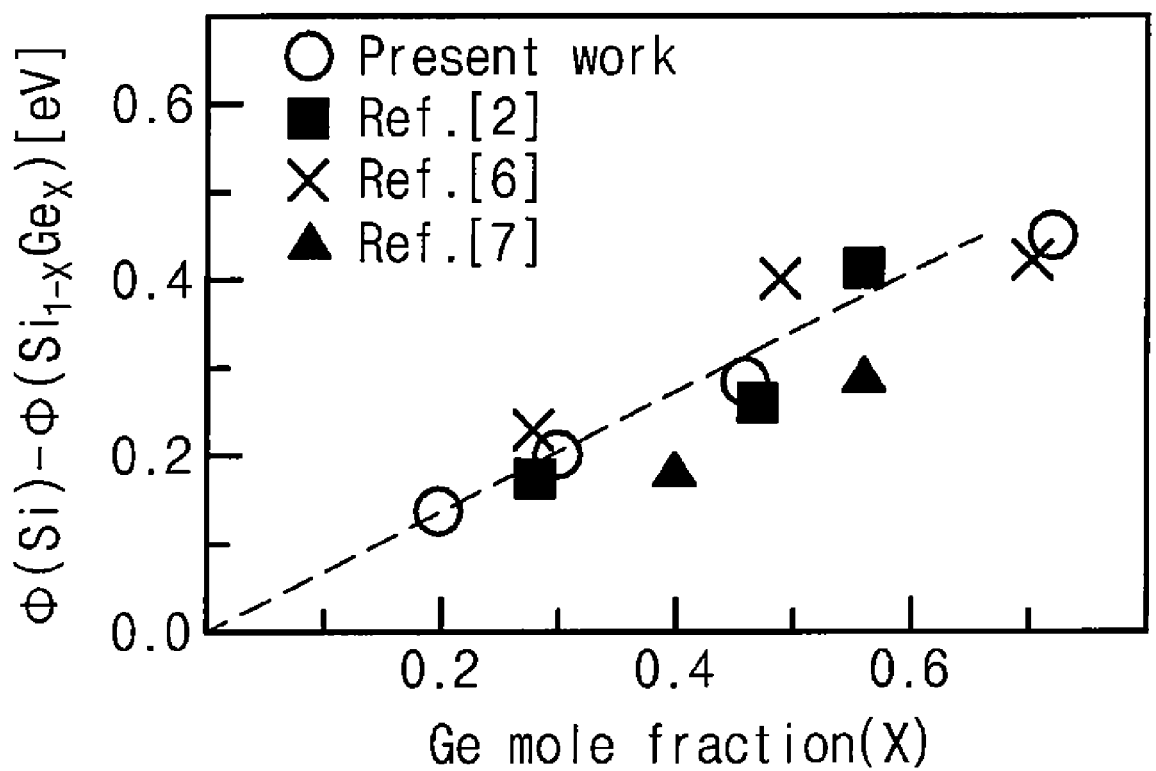
FIG. 6 is a graph illustrating work function versus germanium mole fraction X in a p+ poly silicon ($Si_{1-x}Ge_x$) layer.

FIG. 6 is a graph illustrating work function versus germanium mole fraction X in a p+ poly silicon $(Si_{1-x}Ge_x)$ layer (see "IEEE TRANSACTIONS ON ELECTRON DEVICES, Vol. 47, No. 4, April, 2000, pp 848-855). When the mole fraction of Ge is 0 (X=0), the p+ poly silicon germanium $Si_{1-x}Ge_x$ layer is a p+ poly silicon layer. There is no difference in work function from that of the p+ poly silicon layer. As the mole fraction X increases, the difference becomes larger.

As described above, in a semiconductor device and a method for fabricating the same according to an embodiment of the invention, a lower gate electrode of a fin transistor is formed to have a stacked structure including a p+ poly silicon layer and a p+ poly silicon $(Si_{1-x}Ge_x)$ layer, thereby reducing a GIDL characteristic. Also, a leakage of charges stored in a storage node can be reduced to improve refresh characteristics of DRAM.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:
   forming a device isolation structure on a semiconductor substrate to define an active region;
   selectively etching a portion of the device isolation structure to form a fin-type active region;
   forming a gate structure over the fin-type active region, the gate structure including a silicon germanium layer formed over a polysilicon layer; and
   performing a thermal treatment on the semiconductor substrate to drive dopants of the silicon germanium layer into the polysilicon layer such that the silicon germanium layer expands into the polysilicon layer.

2. The method of claim 1, wherein the step of forming the fin-type active region comprises:
   forming a hard mask layer over the semiconductor substrate;
   forming a photoresist pattern over the hard mask layer to define a recess gate region;
   selectively etching the hard mask layer and the device isolation structure by using the photoresist pattern as an etching mask to form a recess exposing the fin-type active region; and
   removing the photoresist pattern and the hard mask layer to expose the active region including the fin-type active region.

3. The method of claim 1, further comprising performing a soft etching process on the fin-type active region.

4. The method of claim 1, wherein the step of forming the gate structure comprises:
   forming a lower gate conductive layer including the silicon germanium layer and the polysilicon layer over the semiconductor substrate;
   forming an upper gate conductive layer and a gate hard mask layer over the lower gate conductive layer; and
   patterning the gate hard mask layer, the upper gate conductive layer, and the lower gate conductive layer to form the gate structure.

5. The method of claim 4, wherein the polysilicon layer comprises a first p+ layer and a second p+ layer, and the silicon germanium layer comprises a p+ polysilicon layer, the step of forming the lower gate conductive layer comprising:
   forming the first p+ polysilicon layer over the semiconductor substrate;
   forming the p+ polysilicon germanium layer over the first p+ polysilicon layer; and
   forming the second p+ polysilicon layer over the p+ polysilicon germanium layer,
   wherein the step of performing the thermal treatment process on the semiconductor substrate forms a stacked structure of the p+ polysilicon layer and the p+ polysilicon germanium layer.

6. The method of claim 1, further comprising forming a gate insulating film over the active region including the fin-type active region.

7. The method of claim 1, further comprising forming a LDD region on the semiconductor substrate at both sides of the gate structure.

8. The method of claim 7, wherein a thickness of the silicon germanium layer is at least equal to a depth of the LDD region.

9. A method for fabricating a semiconductor device, the method comprising:
forming a device isolation structure on a semiconductor substrate to define an active region;
etching a portion of the device isolation structure to form a fin-type active region; and
forming a gate structure over the fin-type active region, the gate structure including a polysilicon layer, a doped polysilicon layer over the polysilicon layer, and a gate conductive layer over the doped polysilicon layer, the gate conductive layer including metal,
wherein the doped polysilicon layer is a silicon germanium defined as $Si_{1-x}Ge_x$, where $0<X<1$ and X is a Ge mole fraction,
wherein a lower surface of the doped polysilicon layer is provided below an upper surface of the fin-type active region.

10. The method of claim 9, wherein the doped polysilicon is formed by implanting dopants into the polysilicon layer and preforming a thermal treatment of the substrate.

* * * * *